United States Patent [19]

Noneman et al.

[11] Patent Number: 5,602,876
[45] Date of Patent: Feb. 11, 1997

[54] ADVANCED PARAMETER ENCODER WITH PULSE-ON-PULSE DETECTION AND PULSE FRAGMENT RECONSTRUCTION

[75] Inventors: Mark E. Noneman, Ramona; Donald A. Porter; Donald L. Lochhead, both of San Diego, all of Calif.

[73] Assignee: TRW Inc., Redondo Beach, Calif.

[21] Appl. No.: 478,155

[22] Filed: Jun. 7, 1995

Related U.S. Application Data

[63] Continuation of Ser. No. 154,908, Nov. 19, 1993, abandoned.

[51] Int. Cl.⁶ .................................................. H03K 9/00
[52] U.S. Cl. ........................ 375/317; 375/340; 375/348; 327/72
[58] Field of Search .................................. 375/317, 340, 375/342, 348, 349; 327/69, 70, 72; 455/305, 226.1

[56] References Cited

U.S. PATENT DOCUMENTS

| | | | |
|---|---|---|---|
| 3,611,149 | 10/1971 | Kimball | 375/348 |
| 4,710,957 | 12/1987 | Boccie et al. | |
| 4,748,642 | 5/1988 | Bertsche | |
| 4,849,992 | 7/1989 | Alderman et al. | |
| 4,876,654 | 10/1989 | Herscher | |
| 5,260,974 | 11/1993 | Johnson et al. | 385/317 |
| 5,271,038 | 12/1993 | Cai | 375/349 |
| 5,351,271 | 9/1994 | Coquerel | |
| 5,425,056 | 6/1995 | Maroun et al. | 375/317 |

FOREIGN PATENT DOCUMENTS

441732  8/1991  European Pat. Off.

*Primary Examiner*—Wellington Chin
*Assistant Examiner*—Timothy J. May
*Attorney, Agent, or Firm*—Michael S. Yatsko

[57] ABSTRACT

In an RF receiver a system is provided to digitally determine when a pulse has stabilized and when a pulse has restabilized after becoming unstable. The restabilized levels can be detected whether they are above or below the initial stabilization level. The system uses the stable information to determine if a pulse-on-pulse signal is being received or if a trailing edge pulse is being received. The system can provide separate information about each pulse in a pulse-on-pulse situation and can provide separate information concerning the leading pulse and trailing pulse when the trailing pulse occurs in the shadow of the leading pulse.

20 Claims, 4 Drawing Sheets

ADVANCED PARAMETER ENCODER WITH PULSE-ON-PULSE DETECTION AND PULSE FRAGMENT RECONSTRUCTION

This is a continuation of U.S. patent application Ser. No. 08/154,908, filed Nov. 19, 1993 and now abandoned.

FIELD OF THE INVENTION

This invention relates to an RF receiver capable of detecting multiple RF pulses of varying amplitude and frequency and reconstructing pulses received simultaneously. The receiver can also detect trailing edge pulses.

CROSS-REFERENCE TO RELATED APPLICATION

This application is related to the following four applications:

"Instantaneous Parameter Measuring Receiver" filed on Aug. 20, 1993 by Don Lochhead, with Ser. No. 08/109,804; "Advanced Parameter Encoder with Dual Integrated Pulse Present Detection and Channel/Sector Arbitration" filed on Nov. 19, 1993 by Mark E. Noneman et al.; "Parameter Encoder Architecture" filed on Nov. 19, 1993 by inventor Mark E. Noneman; and "Advanced Parameter Encoder With Environmental Filter Capability" filed on Nov. 19, 1993 by Mark E. Noneman et al., all of which are hereby incorporated by this reference.

BACKGROUND OF THE INVENTION

Electronic warfare systems are used on modern military aircraft as part of their offensive and defensive capabilities. These electronic warfare systems emit RF signals that travel through space. Radar systems use RF emissions to locate and track opposing aircraft and some radar systems are incorporated within missiles to assist in the self-guided propulsion of a missile to its target. An electronic warfare search receiver is used defensively to detect those RF emissions. The receiver searches the range of frequencies (the RF spectrum) in which the RF emissions are likely to occur. The receiver then detects and analyzes the nature of the RF signals. By determining the characteristics of the signals received, the defender will know the nature of the threat and, for example, will know if a radar guided missile has "locked on" to the defenders aircraft. These systems are used in friendly as well as unfriendly aircraft. In a tactical or strategic environment, the number of aircraft and the density and diversity of the emissions in the RF spectrum is quite large and is expected to increase. Existing detection and monitoring equipment that use wide band search receivers will find the RF emissions difficult or impossible to successfully monitor in such an environment. For example, some existing wide band receiver designs employ a threshold detector that requires the incoming signal to attain a certain amplitude before it is recognized as a true signal apart from the ordinary RF background noise. These receivers are incapable of detecting pulse-on-pulse conditions and accurately reporting the parameters of both pulses. These receivers are also not capable of detecting pulses that occur near the trailing edge of a first pulse. In this circumstance, the trailing edge of a first pulse does not cross back over the threshold level before the occurrence of the second pulse. With the existing designs, it is entirely possible that a first RF pulse received will effectively prevent detection of a second RF pulse, from another emitter, either during the presence of the first pulse or immediately after the first pulse. The first emission source may be identified but the second source is, in effect, masked.

It is unlikely that a single receiver type will be capable of meeting all offensive or defensive threat detection and analysis requirements dictated by the future electronic warfare environment. Instead a set of search and analysis receivers of complimentary capabilities are likely to be required to meet future demands. Trade offs between probability of intercept, bandwidth, simultaneous signal resolution, sensitivity, receiver complexity and power consumption are necessary. Detecting pulse-on-pulse conditions and trailing edge pulse conditions as well as accurately reporting the parameters of both pulses in a pulse-on-pulse condition are important abilities for a modern receiver.

In traditional electronic warfare/electronic support measures (EW/ESM) receivers, techniques are used in which the receivers video output is digitized. Digitization occurs when the amplitude of the input signal exceeds a predetermined threshold level. After the threshold has been crossed, the signal parameters for that signal are digitized. However, if a second signal occurs before the first signal drops below the threshold, then the second signal will not be detected. This allows a continuous wave or long pulsed width signal to prevent detection of subsequent signals occurring simultaneously with the first signal, even if the subsequent signals are significantly larger in amplitude than the first signal.

Simultaneous signal resolution is an important requirement that needs to be addressed in order to reduce the risk that an enemy radar signal will go undetected. With this background it is desirable to provide a wide band receiver that has a high probability of detecting simultaneous and trailing edge signals and that can also measure the phase, frequency, time of arrival, pulse modulation, pulse width and amplitude of each signal.

SUMMARY OF THE INVENTION

The invention is a method and apparatus for processing the log video output of a receiver. The overall system is capable of measuring the signal parameters of RF pulses including frequency, time of arrival, pulse width, pulse amplitude and angle of arrival. To assist in identifying these pulse parameters, the present invention employs a pulse-on-pulse and a trailing edge pulse detection system so that each channel in a channelized receiver has the capability of detecting a pulse-on-pulse condition and a trailing edge pulse condition. The system also has the ability to reconstruct the parameters of pulses that are received in a pulse-on-pulse condition. This ability is important to the accurate reporting of pulse parameters. Pulse-on-pulse detection and pulse reconstruction are accomplished by establishing a criteria for stable pulses such as three consecutive pulse samples must occur within an amplitude window. When this criteria is met the pulse is declared stable and a miss window is established. If a programmable number of amplitude samples falls outside of the miss window, then the pulse is no longer stable. In a pulse-on-pulse condition a new stable condition will be met at which time a new miss window is established. The system continues to track the amplitude samples until there is a loss of stable or a new stable signal with a new stable level following the old stable level. The system continues to track the amplitude samples until there is a loss of stable and end of pulse indication. At this time the system can reconstruct the parameters of the two individual pulses and pass those parameters in a pulse descriptor word (PDW). A trailing edge pulse problem is solved by detecting an end of stable signal and then determining that a subsequent amplitude sample had a higher value than an upper limit of a miss window that was established when the amplitude samples reversed direction. The system may then establish a new stable for the trailing edge pulse and report the trailing edge pulse in a pulse descriptor word. Therefore, each channel in the receiver will be capable of detecting pulse-on-pulse conditions and trailing edge pulses and will be able to reconstruct the parameters for pulse-on-pulse conditions.

The log video of the receiver is sampled at a high rate of between 20 and 50 nanoseconds that enables the detection of short pulses. The threshold has hysteresis such that when an amplitude sample first crosses the amplitude threshold the amplitude threshold is automatically lowered by a preprogrammed amount.

Therefore, it is an object of the present invention to provide a receiver with the capability of detecting stable pulse conditions and pulse-on-pulse conditions. This enhances the ability of the system to measure the pulse parameters of pulses that have been simultaneously received. It is another object of the invention to provide a trailing edge pulse detector with improved characteristics for spotting pulses that occur in the shadow of a preceding pulse. The foregoing objects and advantages of the invention together with the structure and characteristics thereof, briefly summarized in the foregoing passages, become more apparent to those skilled in the art upon reading the detailed description of the preferred embodiment taken together with the following illustrations.

DETAILED DESCRIPTION OF THE PREFERRED EMBODIMENT

The present invention is a portion of a channelized receiver that converts a log video RF signal to digital information that is used to detect pulse-on-pulse conditions and trailing edge pulses using a method for determining that a pulse is stable. The novel detection and discrimination apparatus and method will now be described.

Figure 1:
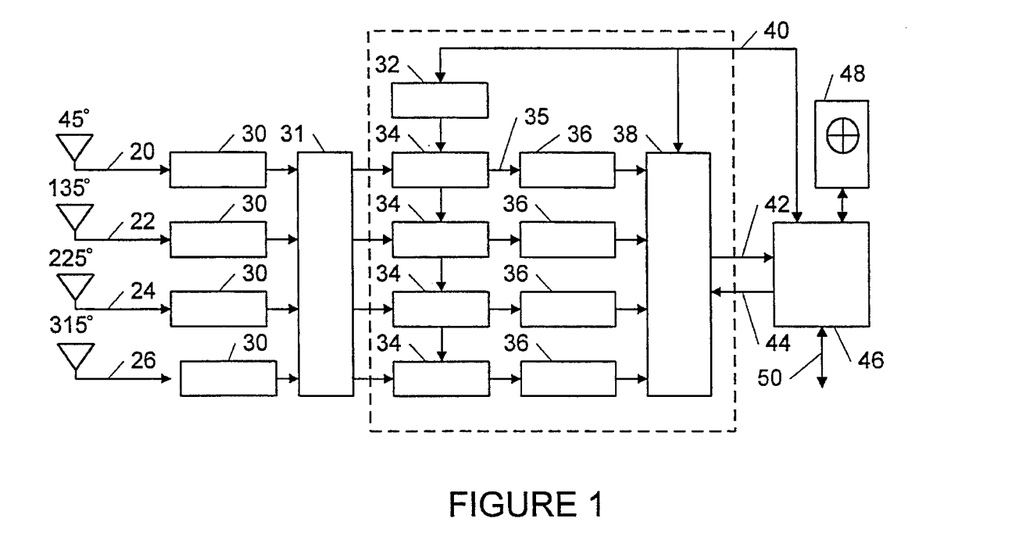
FIG. 1 is a simplified block diagram of an overall channelized receiver system.

FIG. 1 is an overall block diagram of a channelized receiver that would be employed in an aircraft to receive, detect and analyze RF signals from a variety of possible emission sources including enemy aircraft, enemy missiles and fixed radar locations. FIG. 1 shows a channelized receiver in which the present invention can be used. This is an illustration of the type of receiver that would suitable for the present invention although the present invention can be used in other types of receivers such as narrow band single channel and interferometer receivers. Antennas 20, 22, 24 and 26 represent the four antennas that would typically be used to cover 360° of spatial domain surrounding an aircraft. Each antenna receives signals from approximately 90° of air space to cover the entire 360° range. The receivers 30 are identical and receive the signals intercepted by antennas 20–26. The receivers 30 are typically wide band, front end low noise amplifiers that are placed close to the antennas to minimize noise interference that could be introduced through long cable connections. Bus 40 is a command and control bus that is used to coordinate and control the overall function of the channelized receiver. Each output of the receiver is connected to an IF switch 31 and tuner 34. Local oscillator 32 is connected to each of the tuners 34 to provide the tuners with the ability to select IF frequency bands and down convert a bandwidth from, for instance, 6 to 7 gigahertz for an individual receiver to 0.5–1.5 gigahertz. The output bandwidth of each tuner 34 is connected to one of the four channelizers 36. The channelizers 36 consist of a number of adjacent band-pass filters that are used to discriminate between signals that may be contained in various frequencies across the spectrum selected by the IF tuner. Each of these band-pass filters can cover a frequency range of from 20 to 100 MHz and typically will have a crossover with its adjacent filter at −1 dB of attenuation. The outputs of the channelizers are connected to the parameter encoder module 38 which is ultimately responsible for producing a pulse descriptor word for each separate signal that has been received across the frequency spectrum covered by antennas 20–26 and receivers 30. The pulse descriptor word which is a long digital word describing the individual characteristics of each received signal is transferred to an emitter identification processor 46 that determines the nature and possible significance of any signal that is received. The emitter identification processor 46 then transfers information concerning the received signal to a cockpit display 48, for instance, or via line 50 to an aircraft controller. FIG. 1 is intended to identify an overall system in which the present invention is useful.

Figure 2:
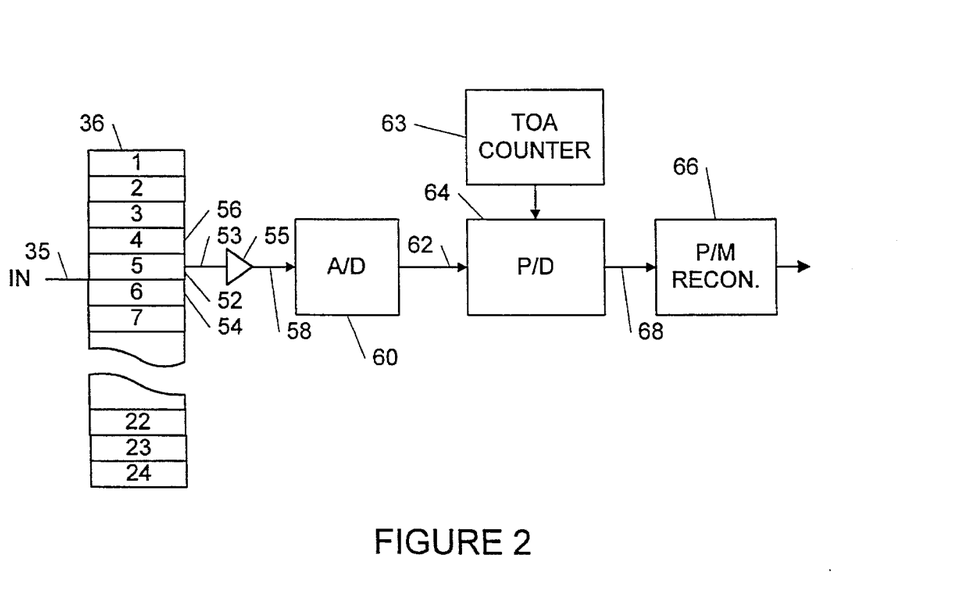
FIG. 2 is a more detailed block diagram showing the location of the pulse detector and pulse measurement reconstruction sections.

FIG. 2 is a more detailed block diagram of the portion of the channelized receiver in which the invention is useful. Input 35 to the channelizer 36 is distributed among, for example, 24 separate band-pass filters in channelizer 36. Each band-pass filter is responsible for a specific portion of the frequency spectrum covered by its associated tuner 34. Each of the individual band-pass filters in channelizer 36 has an output which is connected through a logarithmic detector amplifier 55 to an A/D converter 60. To illustrate this, band-pass filter 52 is connected via line 53 to amplifier 55 which is connected via line 58 to A/D converter 60. The output of the logarithmic amplifier detector 55 is a log video output. Any RF signal with a frequency covered by band-pass filter 52 will appear on the log video output line 58. The adjacent band-pass filters 54 and 56 cover frequency spectrums that are above, below and adjacent to the frequency spectrum covered by band-pass filter 52. Therefore, each of the 24 band-pass filters will have its associated logarithmic detector amplifier 55 and A/D converter 60 which in turn will have its associated pulse detection and arbitration modules discussed below. The A/D converter 60 continuously samples its log video input on a periodic basis and converts the log video into, for example, an 8-bit digital word that represents the instantaneous amplitude of the input video signal. These digital words are transferred to the pulse detector 64 and to the pulse measurement and reconstruction (P/M & R) block 66. The pulse detector 64 is connected via line 68 to the P/M & R block 66. The pulse detector module 64 has an associated Time of Arrival (TOA) counter 63 that is used to determine the time of arrival or when a pulse is first detected. The time of arrival corresponds to the leading edge of a received RF signal. The output of the pulse detection module 64 is transferred on line 68 to the pulse measurement and reconstruction block 66 that measures parameters for each detected signal.

Figure 3:
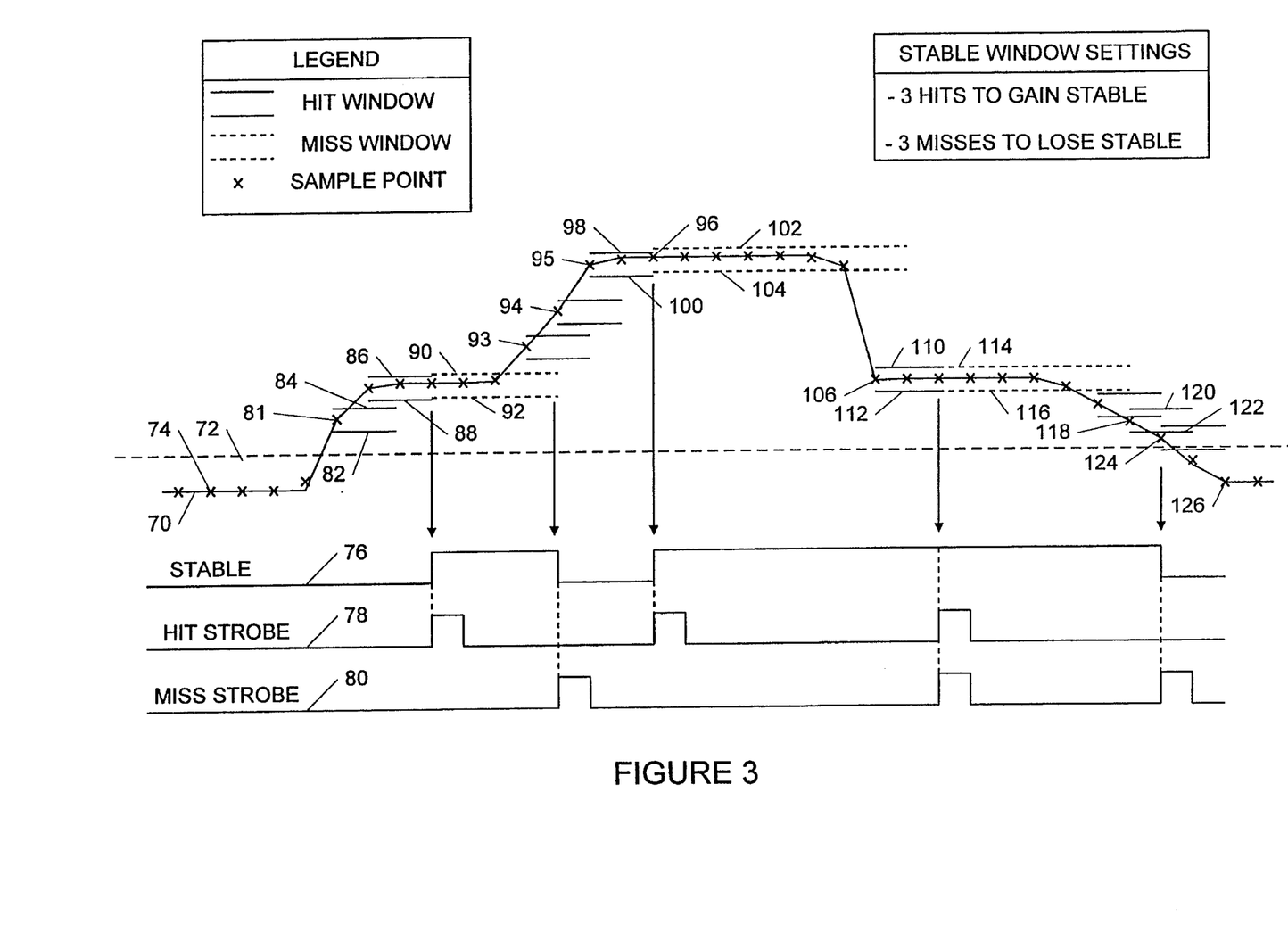
FIG. 3 is a waveform diagram showing the method of determining stable signals.

FIG. 3 is a waveform diagram illustrating one manner in which stable pulses can be detected and recorded. Waveform 70 is intended to illustrate a pulse-on-pulse condition. Amplitude sample 74 is an amplitude sample that is below the threshold level 72. Waveform 76 goes high when a stable pulse has been detected and goes low when the pulse has lost stable. Waveform 78 goes high when the waveform 70 has become stable and waveform 80 goes high when waveform 70 has lost stable. As legend 128 indicates, solid lines bracketing amplitude samples indicate the establishment of a hit window and dashed lines bracketing amplitude samples indicate a miss window has been established. The hit window is also referred to as an acquisition window and the miss window is also referred to as a track window. A hit window is declared in this instance when three consecutive amplitude samples fall within a predetermined voltage range. This voltage range is determined by adding and subtracting a predetermined offset to any pulse sample that does not fall with the previously defined hit window. After a pulse has been declared stable, a miss window is established by adding and subtracting a different predetermined offset to the average valve of the pulse samples that occurred within the hit window. If, for example, three consecutive amplitude samples fall outside the miss window then the pulse has lost stable and waveform 80 becomes true. In this particular example it takes three consecutive amplitude samples within a hit window to declare a pulse stable and three consecutive amplitude samples outside of the miss window to determine that a pulse has lost stable. This is shown in block 130. The criteria for determining that a pulse has terminated is, for example, that two consecutive amplitude samples must occur below the voltage threshold 72. The first amplitude sample 81 above the threshold 72 causes the establishment of hit window shown by lines 82 and 84. The next amplitude sample establishes the hit window shown by lines 86 and 88. When amplitude sample 85 occurs, three consecutive amplitude samples have fallen within the limits of the hit window shown by lines 86 and 88. The pulse has now gained stable and waveforms 76 and 78 go high. Waveform 78 is a single clock cycle strobe lasting one sample period; however, waveform 76 will stay high until there is a loss of stable. Each time an amplitude sample falls outside of a miss window, then a new hit window is established as the circuitry is looking for three consecutive amplitude samples to fall within a single hit window. Thus, when sample 93 occurs it establishes a hit window and when sample 94 occurs it also establishes a new hit window as indicated in FIG. 3. When amplitude sample 95 occurs it also is the third consecutive amplitude sample to fall outside the miss window shown by lines 90 and 92. This causes the stable waveform 76 to go low and the miss waveform 80 to go high for one clock cycle. When the amplitude sample 96 occurs three consecutive amplitude samples have fallen within the hit window shown by lines 98 and 100 causing the hit waveform 78 and the stable waveform 76 to go high. This also causes the establishment of the miss window shown by lines 102 and 104. The system will continue to sample the amplitude of the waveform 70 until sample 106 occurs. Amplitude sample 106 causes the establishment of the hit window shown by lines 110 and 112. When amplitude sample 108 occurs two things happen. First, it is the third consecutive amplitude sample outside of the miss window shown by lines 102 and 104. Also, it is the third consecutive amplitude sample to fall within the hit window shown by lines 110 and 112. This causes both the hit waveform 78 and the miss waveform 80 to go high. Under these conditions the waveform has gone from a stable condition to a stable condition and the stable waveform 76 stays high. If the criteria for a new stable condition is met before the criteria for a loss of stable, a new stable condition would be declared.

Again, each time an amplitude sample falls outside of a previously established miss window a new hit window will be established to determine whether or not the pulse will stabilize within that hit window. Another amplitude sample occurring outside of the hit window will cause the establishment of a new hit window. This process will continue until the pulse stabilizes or terminates. Thus, when amplitude sample 118 occurs it establishes the hit window shown by lines 120 and 122 (several hit windows are shown in the drawing and are not discussed). When amplitude sample 124 occurs it is the third consecutive amplitude sample that has fallen outside the miss window shown by lines 114 and 116 and causes the stable waveform 76 to go low. It also causes the miss waveform 80 to go high for one sample period. When amplitude sample 126 occurs another event takes place. In this instance it takes two consecutive amplitude samples below the voltage threshold 72 to trigger an end of pulse signal. The above described function is important for the systems ability to detect pulse-on-pulse conditions and to reconstruct the parameters of pulse-on-pulse conditions.

Figure 4:
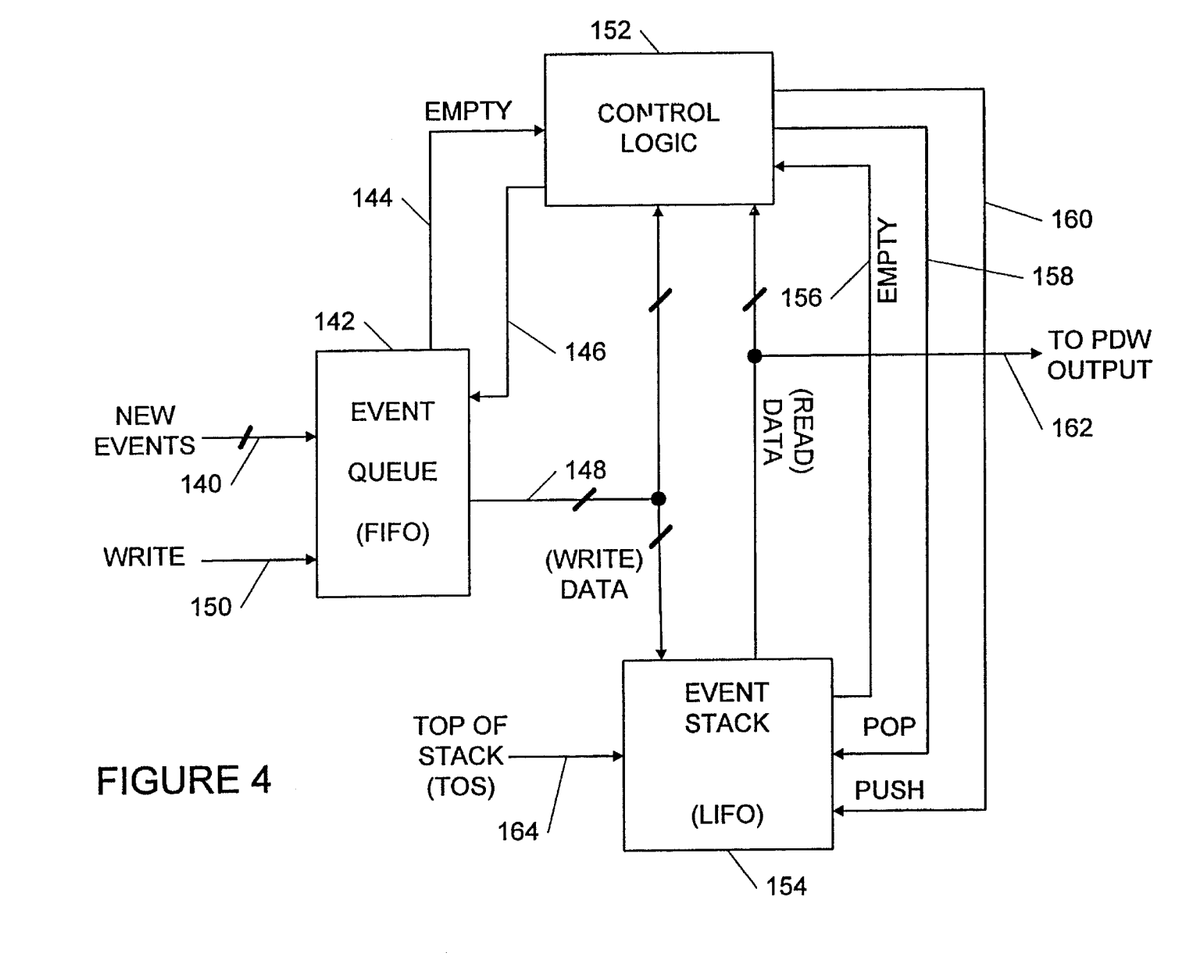
FIG. 4 is a block diagram showing the pulse reconstruction diagram of the present invention.

FIG. 4 is a block diagram showing a circuit that is used to analyze the two separate pulses of a pulse-on-pulse condition and to explain how they are reconstructed and reported in pulse descriptor words. The operation of the block diagram in FIG. 4 will be described with reference to the waveform previously described in FIG. 3. The events described with respect to waveform 70 in FIG. 3 that drive the circuitry of FIG. 4 are the hit events in waveform 78 and the loss of signal event which takes place upon amplitude sample 126 in FIG. 3. Therefore, amplitude samples 85, 96 and 108 cause hit events and amplitude sample 126 causes a loss of signal event.

Before amplitude sample 85 occurs there has been no hit event therefore the data on the new event line 140 in FIG. 4 is zero and the event queue 142 is empty. Input line 140 is a digital input that accepts a predetermined number of bits of amplitude information representing the amplitudes shown in FIG. 3. The event queue 142 in FIG. 4 waits for data to appear on input line 140. Line 144 tells the control logic module 152 when there is no data in event queue 142. When amplitude sample 85 occurs that amplitude data is written into the event queue 142 using line 140 and write signal 150. When data appears on line 148, the empty signal 144 will go false telling the control logic module 152 that data is available. The control logic module samples the event stack 154 to determine if the event stack is empty. The event stack 154 signals the control logic 152 via line 156 when the event stack 154 is empty. If the event stack is empty then the control logic causes the data in event queue 142 to be loaded onto the event stack 154 via line 148. The event queue 142 continues to wait for more event amplitude information to be transferred to the event queue 142 on line 140. This happens when amplitude sample 96 occurs at which time that amplitude information is transferred to the event queue 142. If the event stack 154 is empty, then the event queue 142 transfers its data on the event stack 154. If the event stack 154 is not empty then the control logic compares the amplitude of the information in the event queue output 148 to the amplitude information contained on the top of the event stack 154. At this point it should be noted that the amplitude transferred to the event queue 142 consists of three levels of information. The first piece is the low-amplitude represented by the lower limit of the miss window. The second is the mid-amplitude represented by the actual amplitude sample such as amplitude sample 85 and the high-amplitude information is represented by the amplitude of the upper limit of the miss window that is represented by line 90 in FIG. 3. If the mid-amplitude data in the event queue output 148 is greater than the high-amplitude data on the top of the event stack 154 then the amplitude information in the event queue output 148 is pushed to the top of the event stack 154. Event queue 142 then waits for more data. The next event is when amplitude sample 108 occurs indicating that the pulse has again stabilized. The control logic then compares the mid-amplitude information in event output 148 to the low-amplitude event information on the top of the event stack 154. If the mid-amplitude data in event output 148 is less than the low-amplitude data on the top of event stack 154 then the control logic instructs the event stack 154 to pop via line 158, the amplitude data on the top of the event stack 154 to the PDW output line 162. The popped amplitude data is the amplitude data from sample 96 in FIG. 3. That data becomes part of a pulse descriptor word. The control logic 152 then polls event stack 154 to determine if it is empty. Since event stack 154 is not empty it compares the amplitude of the data in event queue output 148 to the amplitude of the data on the top of the event stack 154. The data on event queue output 148 is still the amplitude data from amplitude sample 108 shown in FIG. 3. If the mid-amplitude data in event queue output 148 is less than the event stack 154 high-amplitude data and the event queue output 148 mid-amplitude data is greater than the event stack 154 low-amplitude data (which in this case is true), then the event queue data is associated with the previously measured data as stored on the top of the event stack 154. The event queue output 148 data is therefore discarded by reading the queue without writing the data onto the event stack 154. When an end of signal event occurs on the event queue output 148, as with sample 126 in FIG. 3, all data remaining on the event stack 154 is written out as a PDW on line 162. After all data has been popped off of the event stack 154, the end of signal event is discarded.

In this manner the two pulses which make up waveform 70 shown in FIG. 3 are taken apart and reconstructed to show that there is actually a higher amplitude shorter duration pulse superimposed on a lower amplitude longer duration pulse. A pulse descriptor word is then reported for each pulse.

Trailing edge pulse detection will now be discussed with reference to FIG. 5.

Figure 5:
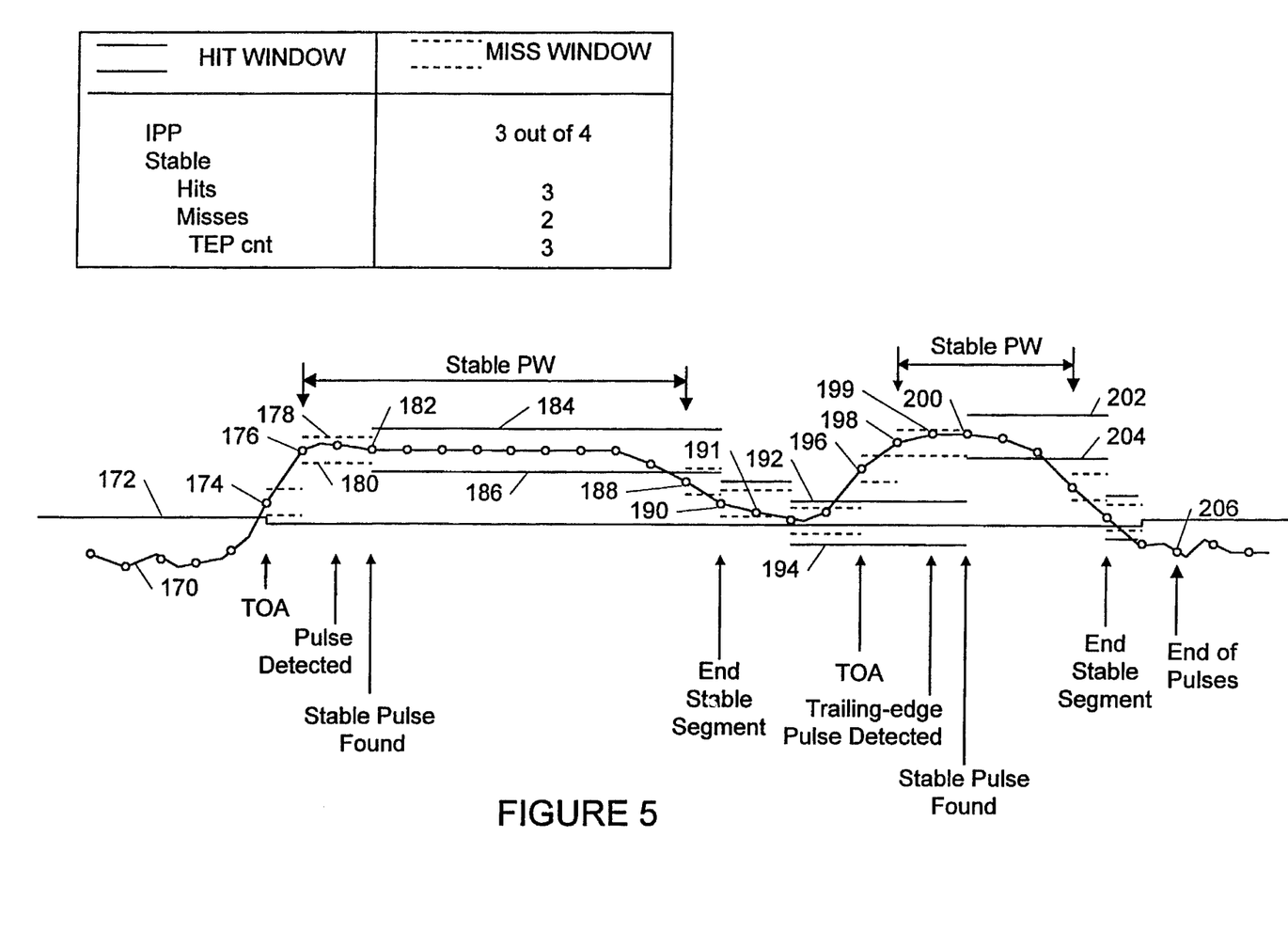
FIG. 5 is a detailed waveform diagram showing trailing edge pulse detection system of the present invention.

FIG. 5 is a waveform diagram showing how a trailing edge pulse is detected so that it can be reported in a separate pulse descriptor word.

Once a signal reaches stable and then loses stable, the stable miss window will track the amplitude samples in order to detect pulses that start during the trailing edge of the first pulse. If the amplitude rises above the upper miss window limit, the miss window is held constant and the number of samples above the limit is counted. If a programmable number of consecutive samples are above the miss window upper limit then a trailing edge pulse exists. A trailing edge pulse is treated the same as a signal that has gained integrated pulse presence for data sampling and processing purposes. FIG. 5 illustrates this operation. Waveform 170 in FIG. 5 is shown with amplitude samples in the form of circles drawn on the waveform 170. When waveform 170 crosses the amplitude threshold 172, amplitude sample 174 is taken indicating the time of arrival of the pulse. At that time the amplitude threshold 172 is lowered a preprogrammed amount to provide hysteresis to the detection system. This hysteresis prevents a noisy low amplitude pulse from getting fragmented and being reported as many shorter pulses. When amplitude sample 176 occurs, a hit window indicated by lines 178 and 180 is established. When amplitude sample 182 occurs the pulse is declared stable according to the criteria shown in legend 208 and the miss window shown by lines 184 and 186 is established. When amplitude sample 188 occurs a new hit window for that amplitude sample is established because it has occurred outside of the miss window shown by lines 184 and 186. Amplitude sample 190 creates a new hit window and miss window as does amplitude sample 191. When amplitude 196 occurs it is above the upper limit of the miss window shown by line 192. The number of amplitude samples that must be above the upper limit of the miss window shown by lines 192 and 194 is a programmable number. In this case the programmable number was three. When this event occurs at sample 199 the system signals that a new pulse has occurred at the trailing edge of the first pulse and the new pulse is treated exactly the same as all new pulses. When amplitude samples 198 occurs it establishes its hit window and when amplitude sample 200 occurs within the hit window the miss window shown by lines 202 and 204 is established. The system continues to operate in this fashion by having the hit and miss windows track the amplitude samples after loss of stable until amplitude 206 occurs which indicates the end of the pulse. In this manner, a pulse occurring at the trailing edge of a first pulse can be detected. If this method were not used then the trailing edge pulse would be considered to be part of the first pulse and it would not be reported in a separate pulse descriptor word. This method and apparatus increases the probability of intercept for pulses occurring in the shadow of another pulse.

It is believed that the foregoing description of the preferred embodiment of the invention is sufficient in detail to enable one skilled in the art to make and use the invention. However, it is expressly understood that the details of the elements that are presented are not intended to limit the scope of the invention inasmuch as equivalence to those elements and other modifications thereof all of which come within the scope of the invention, become apparent to those skilled in the art upon reading this specification. Thus, the invention is to be broadly construed within the full scope of the appended claims.

What is claimed is:

1. A system for identifying pulses having a stable amplitude comprising:

receiver means for receiving an electronic signal, converter means for generating amplitude samples by converting said electronic signal to digital data at a periodic rate, said converter means being connected to said receiver means,     threshold means for establishing a threshold voltage,     hit window means, coupled to said converter means and said threshold means, for establishing a voltage hit window with an upper limit above the amplitude of said sample and a lower limit below the amplitude of said sample when the amplitude of said sample exceeds said threshold voltage, said voltage hit window being established every time the amplitude of a new sample occurs above said threshold voltage and outside of a previously established hit window, miss window means, coupled to said converter means and said hit window means, for establishing a voltage miss window having an upper limit and a lower limit, said miss window being established when a first predetermined number of amplitude samples fall within a previously established hit window; and stability identifying means, associated with said hit window means and said miss window means, for identifying that a pulse is stable when N consecutive pulses lie within the same hit window and for identifying that a pulse has lost stable when M consecutive pulses lie outside of the same miss window.

2. A system for identifying and reconstructing first and second overlapping pulses having variable pulse lengths wherein said first pulse has an amplitude lower than an amplitude of said second pulse and said second pulse has a duration shorter than a duration of said first pulse comprising:

receiver means for receiving electronic signals:

converter means, connected to said receiver means, for generating amplitude samples by converting said electronic signals to digital data at a periodic rate;

threshold means for generating a threshold signal;

acquisition and tracking means, coupled to said converter means and said threshold means, for establishing amplitude-based track and acquisition windows and for generating hit signals when the amplitude of said amplitude samples exceeds said threshold signal and becomes stable;

comparison means, coupled to said acquisition and tracking means, for storing and comparing the amplitude of said amplitude samples that occur when said hit signals are generated to distinctly identify said first pulse from said second pulse and to provide separate signal data including time of arrival, time of departure and amplitude for said first pulse and said second pulse.

3. A system for detecting trailing edge pulses comprising:

receiver means for receiving electronic signals, converter means connected to said receiver means for generating amplitude samples by converting said electronic signals to digital data at a periodic rate, threshold means for generating a voltage threshold and for comparing said voltage threshold to said amplitude samples to determine when the amplitude of said amplitude samples exceeds said voltage threshold, hit window means for establishing a hit window when the amplitude of one of said amplitude samples occurs above said threshold voltage level, said hit window including an upper limit above the amplitude of said one of said amplitude samples and a lower limit below the amplitude of said one of said amplitude samples, miss window means for establishing a miss window, having an upper limit and a lower limit, when a first predetermined number of amplitude samples fall within a previously established hit window, said hit window means establishing a new hit window each time the amplitude of said amplitude samples falls outside of a previously established hit window, said miss window means establishing a new miss window each time a second predetermined number of amplitude samples fall outside of a previously established miss window, and trailing edge means for determining when a trailing edge pulse is present when an amplitude sample is taken whose amplitude is above the upper limit of a miss window that is established after said electronic signal is no longer stable.

4. A detection system for identifying pulses having a stable amplitude in a receiver which receives radio frequency (RF) signals, said detection system comprising:

converting means for generating amplitude samples from said RF signals at a periodic rate;

threshold means for generating a threshold signal;

acquisition means, coupled to said threshold means and said converting means, for defining an acquisition window when the amplitude of a first amplitude sample exceeds said threshold signal, said acquisition window including an upper limit above the amplitude of said first amplitude sample and a lower limit below the amplitude of said first amplitude sample, said acquisition means for establishing a new acquisition window when the amplitude of a subsequent amplitude sample exceeds the threshold signal and occurs outside of said acquisition window; and stability identifying means, associated with said acquisition means, for identifying that a pulse is stable when a first predetermined number of consecutive pulses lie within the same acquisition window.

5. The detection system of claim 4 further comprising:

tracking means, coupled to said acquisition means, for defining a track window to identify pulses which have lost a stable amplitude, said track window being established when the amplitude of said first predetermined number of consecutive amplitude samples occur within the same acquisition window, wherein said track window includes an upper limit and a lower limit.

6. The detection system of claim 5 wherein said tracking means terminates said track window and said stability identifying means identifies a pulse having an unstable amplitude when the amplitude of a second predetermined number of consecutive amplitude samples fall outside said track window.

7. A method for identifying pulses having a stable amplitude in a receiver which receives radio frequency (RF) signals, comprising the steps of:

generating digital amplitude samples from said RF signals at a periodic rate;

generating a threshold signal;

defining an acquisition window when an amplitude of a first amplitude sample exceeds said threshold signal, said acquisition window including an upper limit above the amplitude of said first amplitude sample and a lower limit below the amplitude of said first amplitude sample; and establishing a new acquisition window when the amplitude of a subsequent amplitude sample occurs outside of said acquisition window, and signalling a stable pulse when a first predetermined number of amplitude samples lie within the same acquisition window.

8. The method of claim 7 further comprising the step of:

defining a track window to identify a pulse having a stable amplitude when the amplitude of a first predetermined number of consecutive amplitude samples occur within said acquisition window, wherein said track window includes an upper limit and a lower limit.

9. The method of claim 8 further comprising the step of:

terminating said track window to identify a pulse having an unstable amplitude when the amplitude of a second predetermined number of consecutive amplitude samples fall outside said track window.

10. A pulse-on-pulse identification system for identifying and reconstructing first and second overlapping pulses having variable pulse lengths in radio frequency (RF) signals which are received by a receiver with a converting means for generating amplitude samples from said RF signals at a periodic rate, comprising:

threshold means for generating a threshold signal;

detecting means, coupled to said converting means and said threshold means, for generating hit signals when the amplitude of said amplitude samples exceeds said threshold signal and become stable; and reconstruction means, coupled to said detecting means, for storing and comparing the amplitudes of said amplitude samples that occur when said hit signals are generated to identify said first and second overlapping pulses and to provide separate signal data including time of arrival, time of departure and amplitude for said first pulse and said second pulse.

11. The pulse-on-pulse identification system of claim 10 wherein said first pulse has a duration longer than said second pulse and said second pulse has an amplitude greater than said first pulse.

12. The pulse-on-pulse identification system of claim 10 wherein said detecting means includes:

acquisition means, coupled to said threshold means and said converting means, for defining an acquisition window when the amplitude of a first amplitude sample exceeds said threshold signal, said acquisition window including an upper limit above the amplitude of first amplitude sample and a lower limit below the amplitude of said first amplitude sample, said acquisition means for establishing a new acquisition window when the amplitude of a subsequent amplitude sample occurs outside of said acquisition window.

13. The pulse-on-pulse identification system of claim 12 further comprising:

tracking means, coupled to said acquisition means, for defining a track window to identify a pulse having a stable amplitude after the amplitude of a first predetermined number of consecutive amplitude samples occur within said acquisition window, wherein said track window includes an upper limit and a lower limit.

14. The pulse-on-pulse identification system of claim 13 wherein said tracking means terminates said track window to identify a pulse having an unstable amplitude when the amplitude of a second predetermined number of consecutive amplitude samples fall outside said track window.

15. The pulse-on-pulse identification system of claim 10 wherein said reconstruction means includes:

a controller coupled to said detecting means;

a queue coupled to said controller; and a stack coupled to said queue and said controller.

16. A method of identifying and reconstructing first and second overlapping pulses having variable pulse lengths in radio frequency (RF) signals which are received by a receiver with a converting means for generating amplitude samples from said RF signals at a periodic rate, comprising the steps of:

generating a threshold signal;

generating hit signals when the amplitude of said amplitude samples exceeds said threshold signal and becomes stable;

storing and comparing the amplitudes of said amplitude samples that occur when said hit signal is generated to identify said first and second overlapping pulses; and providing separate signal data including time of arrival, time of departure and amplitude for said first pulse and said second pulse.

17. The method of claim 16 wherein said step of generating said hit signal includes the steps of:

defining an acquisition window when a first amplitude sample exceeds said threshold signal, said acquisition window including an upper limit above the amplitude of said first amplitude sample and a lower limit below the amplitude of said second amplitude sample;

establishing a new acquisition window when the amplitude of a subsequent amplitude sample exceeds said threshold signal and occurs outside of said acquisition window;

defining an upper limit for said new acquisition window above said subsequent amplitude sample and a lower limit for said new acquisition window below said subsequent amplitude sample; and defining a track window, corresponding to a stable pulse, with an upper limit and a lower limit when the amplitude of a first predetermined number of consecutive amplitude samples occur within said acquisition window.

18. The method of claim 17 further comprising the step of:

terminating said track window corresponding to an unstable pulse when the amplitude of a second predetermined number of consecutive amplitude samples fall outside said track window.

19. A detection system for identifying trailing edges of pulses in radio frequency (RF) signals which are received by a receiver with a converting means for generating amplitude samples from said RF signals at a periodic rate, comprising:

threshold means for generating a threshold signal;

acquisition means, coupled to said threshold means and said converting means, for defining an acquisition window when a first amplitude sample exceeds said threshold signal, said acquisition window including an upper limit above said first amplitude sample and a lower limit below said amplitude sample, said acquisition means for establishing a new acquisition window when the amplitude of a subsequent amplitude sample occurs outside of said acquisition window;

tracking means, coupled to said acquisition means, for defining a track window, corresponding to a stable pulse, with an upper limit and a lower limit when the amplitude of a first predetermined number of consecutive amplitude samples occur within said acquisition window; and edge detection means, coupled to said tracking means and said acquisition means, for identifying a trailing edge pulse, wherein after said tracking means identifies a stable pulse, if the amplitude of said amplitude samples decreases, said tracking means establishes a new track window based on the amplitude of said amplitude samples, and if the amplitude of said amplitude samples increases, said tracking means fixes said track window and designates said trailing edge pulse once the amplitude of a first predetermined number of amplitude samples exceed said track window.

20. A method for identifying trailing edges of pulses in radio frequency (RF) signals which are received by a receiver with a converting means for generating amplitude samples from said RF signals at a periodic rate, comprising the steps of:

generating a threshold signal;

defining an acquisition window with an upper limit and a lower limit based upon an amplitude of a first amplitude sample received above said threshold signal;

establishing a new acquisition window when an amplitude of a subsequent amplitude sample occurs outside of said acquisition window;

defining a track window, corresponding to a stable pulse, with an upper limit and a lower limit when an amplitude of a first predetermined number of consecutive amplitude samples occur within said acquisition window;

identifying a trailing edge pulse, wherein, after said tracking means identifies a stable said step of identifying said trailing edge pulse includes the steps of:

determining if the amplitude of said amplitude samples are increasing or decreasing;

establishing a new track window if the amplitude of said amplitude samples is decreasing; and if the amplitude of said amplitude samples is increasing, fixing said track window and designating said trailing edge pulse when the amplitudes of a first predetermined number of amplitude samples exceed said track window.

* * * * *